(12) United States Patent
Shetty

(10) Patent No.: US 7,155,652 B1
(45) Date of Patent: Dec. 26, 2006

(54) DIGITAL SIGNAL PROCESSING FOR REAL TIME CLASSIFICATION OF FAILURE BITMAPS IN INTEGRATED CIRCUIT TECHNOLOGY DEVELOPMENT

(75) Inventor: Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 503 days.

(21) Appl. No.: 10/446,414

(22) Filed: May 27, 2003

(51) Int. Cl.
*G06F 11/00* (2006.01)

(52) U.S. Cl. ...................... 714/735; 714/732

(58) Field of Classification Search ........... 379/106.01; 348/126; 714/726, 729; 324/765
See application file for complete search history.

(56) References Cited

U.S. PATENT DOCUMENTS

| | | | | |
|---|---|---|---|---|
| 4,741,023 A | * | 4/1988 | Lawson ................. | 379/106.01 |
| 4,872,052 A | * | 10/1989 | Liudzius et al. ............ | 348/126 |
| 5,377,199 A | * | 12/1994 | Fandrich ..................... | 714/726 |
| 6,459,292 B1 | * | 10/2002 | Oikawa et al. ............. | 324/765 |
| 6,748,564 B1 | * | 6/2004 | Cullen et al. ............... | 714/729 |

* cited by examiner

*Primary Examiner*—David Ton
(74) *Attorney, Agent, or Firm*—Mikio Ishimaru

(57) ABSTRACT

A system and method for processing tester information is provided having a system-under-test. A pattern is written to the system-under-test, and a pattern is read therefrom. The pattern written is then compared to the pattern read from the system-under-test. The signal from the comparison is processed, and the signal from the signal processing is then analyzed.

12 Claims, 4 Drawing Sheets

DIGITAL SIGNAL PROCESSING FOR REAL TIME CLASSIFICATION OF FAILURE BITMAPS IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

At the present time, electronic products are used in almost every aspect of life, and the heart of these electronic products is the integrated circuit. Integrated circuits are used in everything from CD players and cameras to microwaves.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not a solution for major problems.

The problems include, but are not limited to, collection and storage of failed bitmaps for future identification of failed bitmap patterns when a semiconductor memory die fails at test.

The problems include, but are not limited to, confirming that a pattern is a result of unreliable testing rather than a process problem prior to investigating process excursions when irregular electrical data problems occur. This requires time to test the related parameters to screen out testing issues.

Solutions to these problems have been long sought but prior developments have not taught or suggested any solutions and, thus, solutions to these problems have long eluded those skilled in the art.

DISCLOSURE OF THE INVENTION

The present invention provides a method for processing tester information. A pattern is written to a unit under test, and a pattern is read therefrom. The pattern written to the unit under test is then compared to the pattern read from the unit. The signal from the comparison is processed, and the signal from the signal processing is then analyzed. This method for processing tester information reduces the need for storing bitmaps and provides a means for identifying periodic patterns in failed bitmaps in real time as soon as the die is tested.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
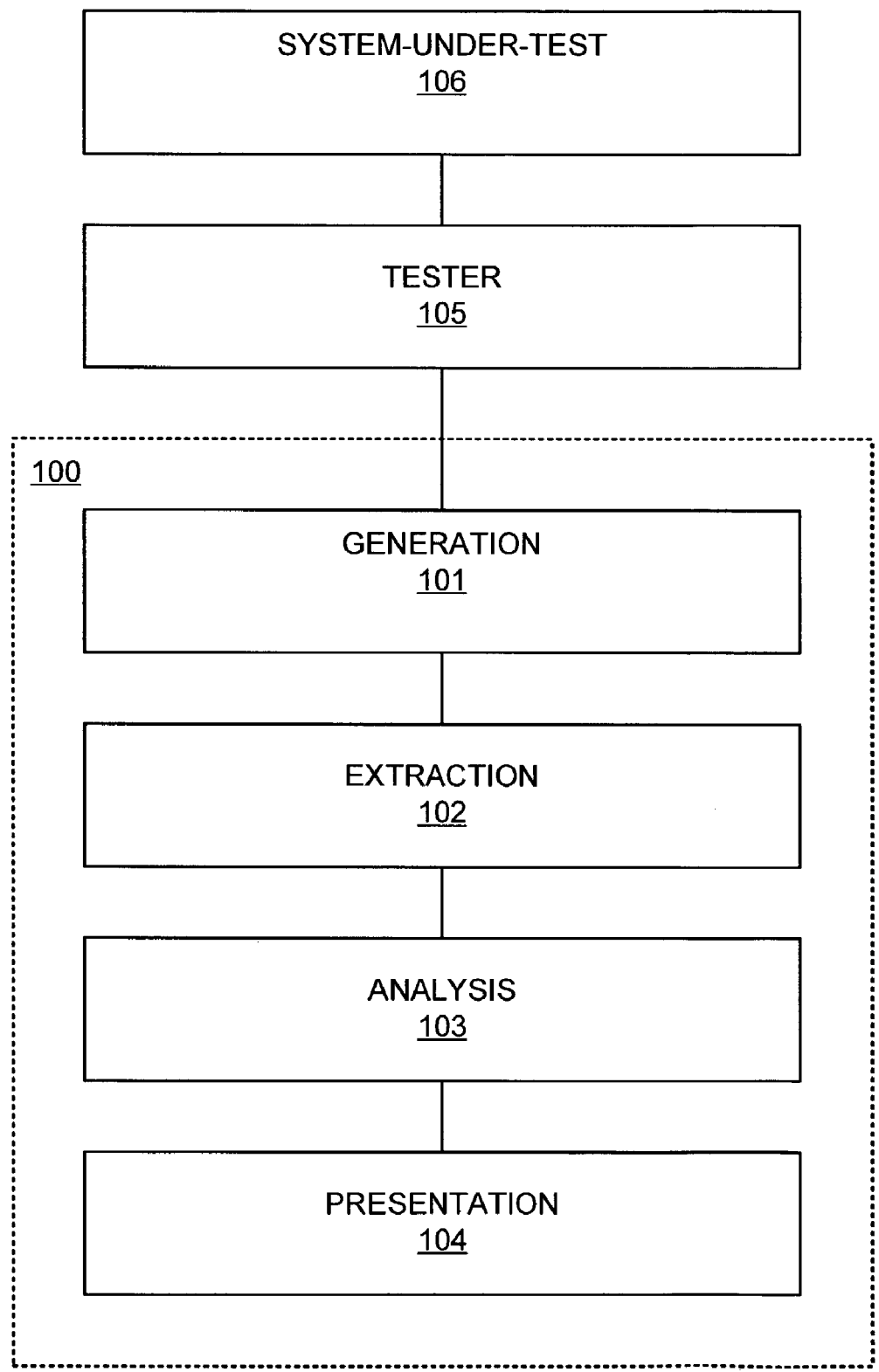
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are generation block 101, extraction block 102, analysis block 103, and presentation block 104. Each of the blocks can stand independently in the can solve the problems presented but often there are four fundamental blocks to solving the problems presented.

The four fundamental blocks are generation block 101, extraction block 102, analysis block 103, and presentation block 104. Each of the blocks can stand independently in the tester information processing system 100, and within these blocks are various commercially available techniques, methodologies, process, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required. In presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
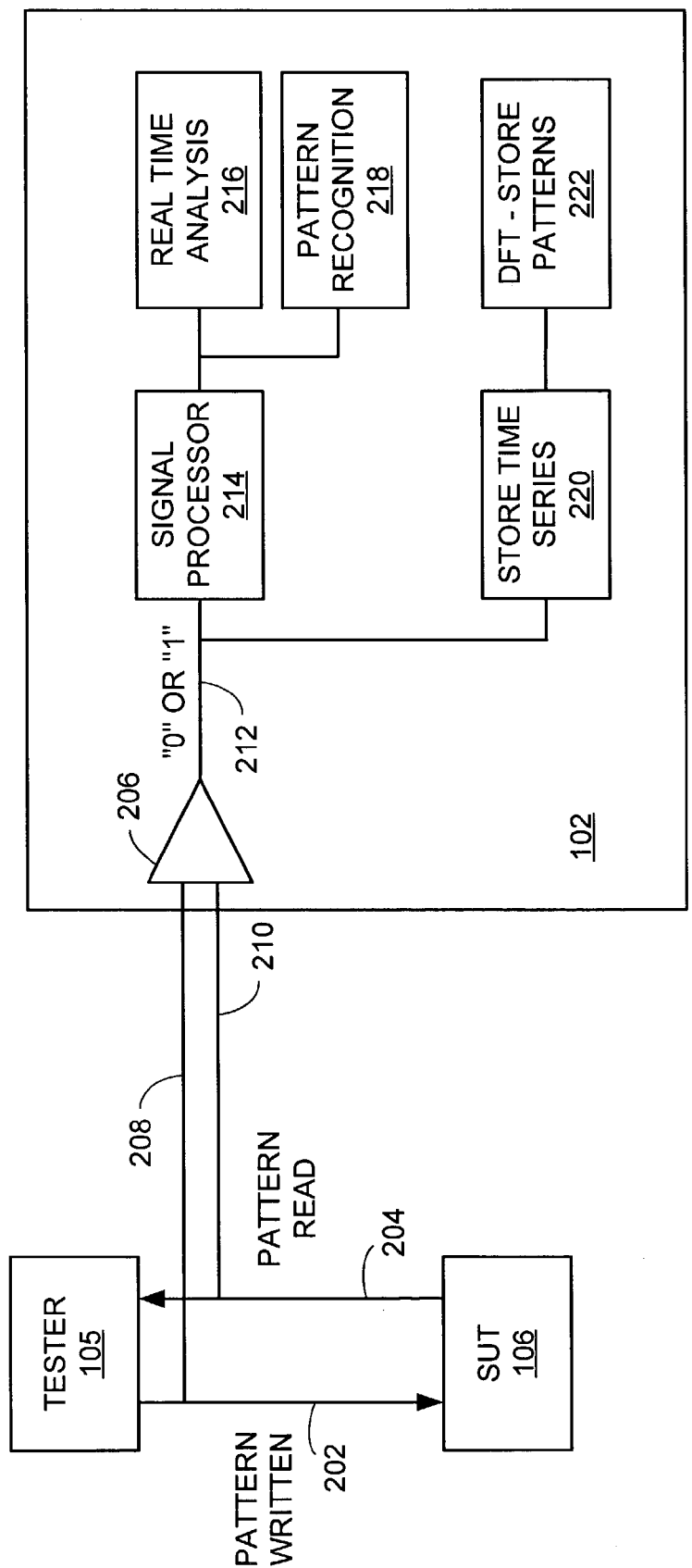
FIG. 2 is a presentation block according to the present invention.

Referring now to FIG. 2, therein is shown the presentation block 104 according to the present invention. An integrated circuit or memory, such as a semiconductor memory die 400 of FIG. 4, which is or is in the system-under-test 106 of FIG. 1, is tested. The extraction block 102 identifies, in real time, the periodic patterns in failure bitmaps collected. Digital signal processing techniques are used to begin classifying the bitmap data looking for repeating patterns within the binary stream of data coming off the tester 105 of FIG. 1 connected to the system-under-test 106. By accomplishing this in real time, the need to bring data out and generate a complicated data file for post-processing at a later time is eliminated.

While digital signal processing techniques are well known in the art, the application of such techniques for processing bitmap data is a novel application and not well known in the art.

Basically, the tester 105 tests each bit of the semiconductor memory die in a predetermined order, usually by row or column. The data is sent out by the tester 105 in a data pattern written sequence 202 and read out from the system-under-test 106 in a data pattern read sequence 204. The data received out of the output of the system-under-test 106 is compared with the data pattern written sequence 202 and the result is a "0" for a match (pass) or a "1" for a mismatch (fail). The comparison is performed by a comparator 206 having a first input 208 connected to receive the data pattern written sequence 202 and a second input 210 connected to the data pattern read sequence 204. A comparison signal from the comparator 206 is provided by an output 212 to a signal processor 214.

The signal processor 214 receives and processes the comparison signal to produce a processed signal for real time analysis in real time analysis block 216. The signal processor 214 performs functions like sampling the data from the output pins of the system-under-test 106, converting the voltages on the output to the discrete binary levels and filtering out unwanted noise. The processed signal from the signal processor 214 is also capable of being further processed by pattern recognition circuitry 218 to determine patterns of failure.

The comparison signal from the comparator 206 can further be stored in a store time series block 220 for use in immediate or future comparisons or analysis.

The comparison signal from a first semiconductor memory die can be recalled with a comparison signal from a second memory die. The comparison signals are then transformed in a DFT transform block 222 by an orthogonal transform. Orthogonal transforms and transform properties permit analysis of a signal given some knowledge of its constituent parts. The discrete Fourier transform (DFT) is the counterpart of the Fourier transform in the discrete time domain. The transformation allows patterns to be "found" by finding correlations between the patterns of the two comparison signals.

With each of the different analyses of the signals out of the comparator 206, the need for storing bitmaps is eliminated by storing only the patterns. Further, the stored patterns allow identifying periodic patterns in the failed bitmaps in real time as soon as the semiconductor memory die is tested.

While the above description relates to the physical elements according to the present invention, it will be understood that the description would also relate to a flow chart for a method for performing the various functions according to the present invention.

Figure 3:
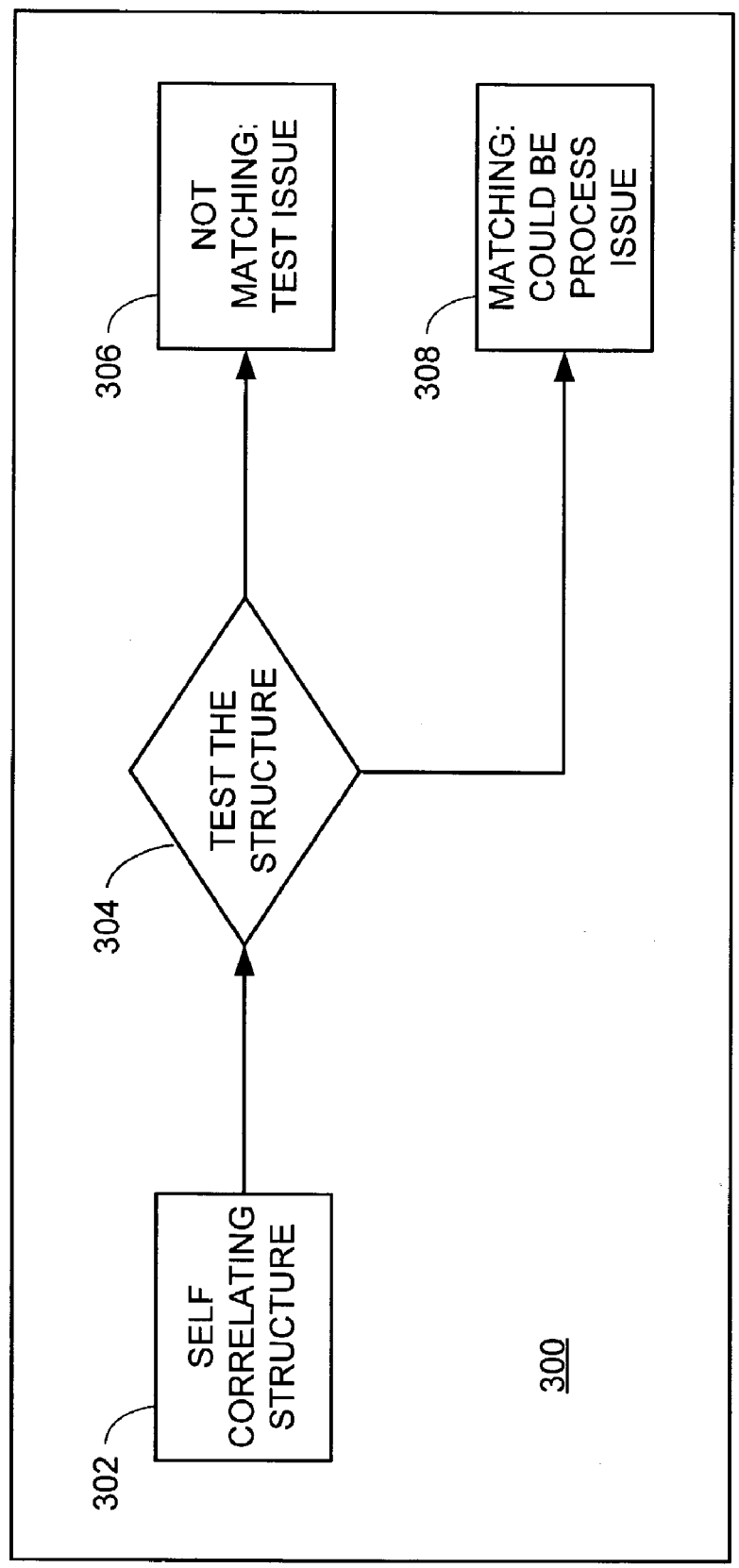
FIG. 3 is a flow chart of a method for separating, testing, and processing related effects on data relating to self-correlation structures in according to the present invention.

Referring now to FIG. 3, therein is shown a flow chart 300 of a method for separating, testing, and processing related effects on data relating to self-correlation structures.

The method 300 includes a step 302 of providing a self-correlating structure; a step 304 of testing the self-correlating structure; a step 306 determining a lack of a match being a test issue; and a step 308 where there is a match indicating that there is a process issue.

The self-correlating structures exist in many forms. For example, the n-well resistances are tied to the p-channel transistor parameters. In another example, voltage thresholds may also be self-correlating.

Generally, the self-correlating test structures require only testing one of the related parameters in an irregular electrical data pattern for verification that the data is invalid and not merely a testing issue. The purpose of this self-correlating test structure is to save time since there's the need to only test one of the related parameters to ensure the general functionalities and operation of both.

In the present invention, both parameters are tested and it is determined from the lack of a match that the problem is a test issue and from the matching that it could be a process issue, or a manufacturing processing problem, which affects both parts of a self-correlating test structure.

Figure 4:
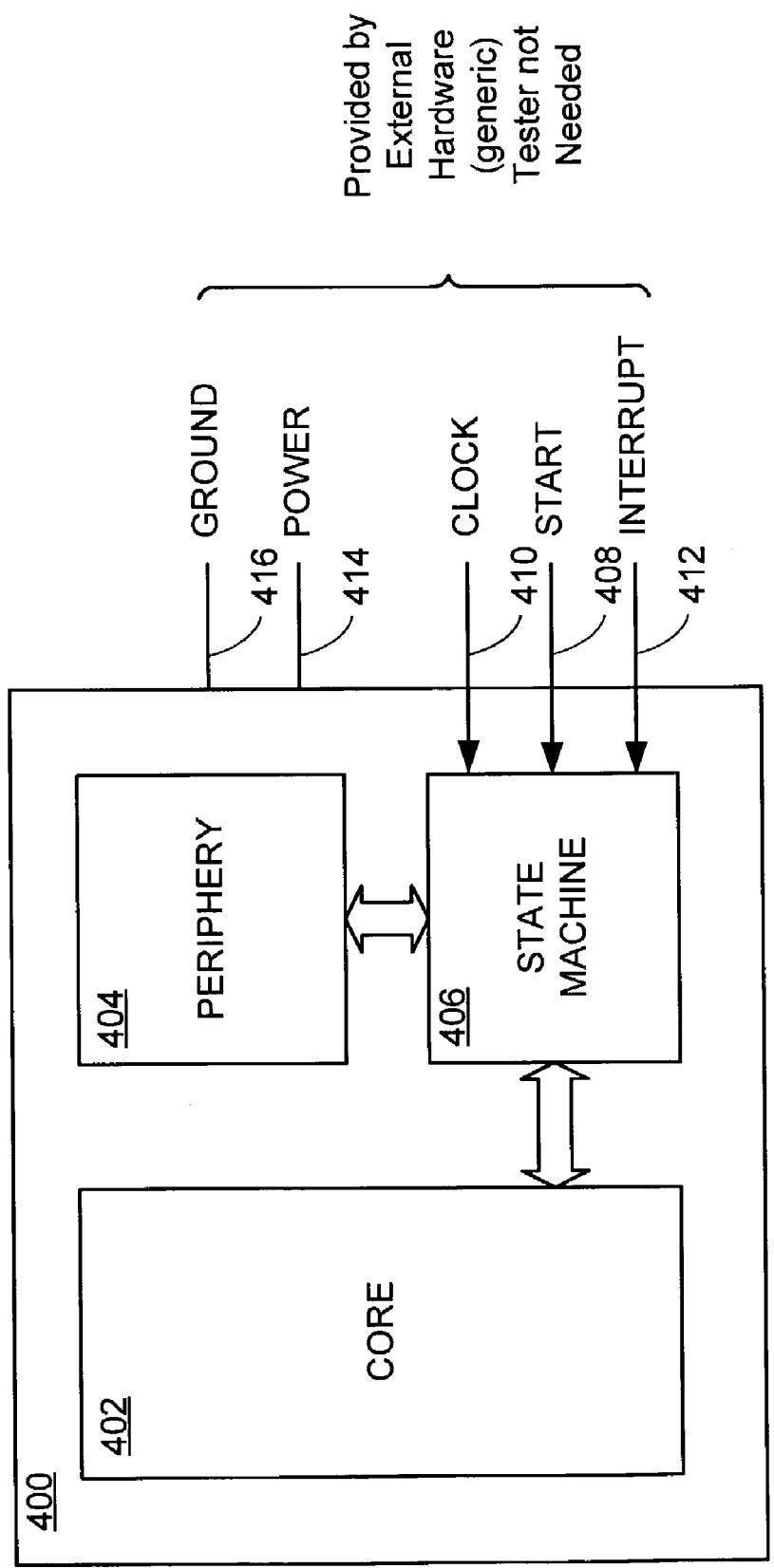
FIG. 4 is a view of an integrated circuit die of a FLASH memory device.

Referring now to FIG. 4, therein is shown an integrated circuit or memory, such as the semiconductor memory die 400, having a memory core 402 and periphery circuitry 404. A state machine 406 is positioned between the memory core 402 and the periphery circuitry 404.

Using a state machine designed into the semiconductor memory die 400 rather than the use of the tester 105 to initiate the cycling will reduce the cycling time, and therefore the cycling test time, on the semiconductor memory die 400. As its input, the state machine 406 uses an start signal 408 to sequentially output erase and program signals for the memory core 402. A clock signal 410 is provided to the state machine 406 provided from an external generator, or generated internally. A simple board, or wafer level probe card, if done on a wafer level, can provide power to the semiconductor memory die 400, which can then be cycled until provided with an interrupt signal 412 on separate hardware freeing up the tester 105. During cycling, the program and erase speed data can also be stored in registers to keep track of program/erase speed degradation.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for processing tester information comprising:
writing a data pattern written sequence from a tester to a system-under-test;
reading a data pattern read sequence by the tester from the system-under-test;
comparing the data pattern written sequence to the system-under-test with the data pattern read sequence from the system-under-test to provide a comparison signal;
processing the comparison signal to provide a processed signal;
analyzing the processed signal to provide an analysis thereof; and
receiving a first comparison signal from a first system-under-test;
receiving a second comparison signal from a second system-under-test; and
storing the first and second comparison signals.

2. The method as claimed in claim 1 wherein analyzing includes real time analysis of the processed signal.

3. The method as claimed in claim 1 additionally comprising:
receiving the processed signal; and
recognizing patterns in the processed signal by using a pattern recognition process.

4. The method as claimed in claim 1 additionally comprising:
transforming the first and second comparison signals using a discrete Fourier transform.

5. A tester information processing system comprising:
a tester for writing a data pattern written sequence from a tester to a system-under-test and for reading a data pattern read sequence from the system-under-test;
a comparator connected to the tester for comparing the data pattern written sequence to the system-under-test with the data pattern read sequence from the system-under-test to provide a comparison signal;
a signal processor connected to the comparator for processing the comparison signal to provide a processed signal; and
an analysis system connected to the signal processor for analyzing the processed signal to provide an analysis thereof wherein the analysis system includes circuitry for receiving a first analyzed signal from a first system-under-test and for receiving a second analyzed signal from a second system-under-test, and the circuitry for comparing the first and second analyzed signal in real time to determine similarities, differences, or a combination thereof.

6. The system as claimed in claim 5 additionally comprising a pattern recognition system for receiving the processed signal and recognizing patterns in the processed signal by using a pattern recognition process.

7. The system as claimed in claim 5 additionally comprising a store time series system connected to the comparator for storing patterns of comparison signals.

8. The system as claimed in claim 5 additionally comprising a discrete Fourier transform system connected to the comparator for transforming patterns of comparison signals using a discrete Fourier transform.

9. A method for processing tester information comprising:
writing a data pattern written sequence from a tester to a system-under-test;
reading a data pattern read sequence by the tester from the system-under-test;
comparing the data pattern written sequence to the system-under-test with the data pattern read sequence from the system-under-test to provide a comparison signal;
processing the comparison signal to provide a processed signal;

analyzing the processed signal to provide an analysis thereof;

receiving a first comparison signal from a first system-under-test;

receiving a second comparison signal from a second system-under-test; and transforming the first and second comparison signals using a discrete Fourier transform.

10. The method as claimed in claim 9 wherein analyzing includes real time analysis of the processed signal.

11. The method as claimed in claim 9 additionally comprising recognizing the pattern of the processed signal.

12. The method as claimed in claim 9 additionally comprising:

receiving the processed signal; and recognizing patterns in the processed signal by using a pattern recognition process.

* * * * *